(12) United States Patent
Hensley et al.

(10) Patent No.: US 6,430,050 B1
(45) Date of Patent: Aug. 6, 2002

(54) MECHANICAL LOADING OF A LAND GRID ARRAY COMPONENT USING A WAVE SPRING

(75) Inventors: James David Hensley, Rocklin; Stephen Daniel Cromwell, Penryn; Gregory S. Meyer, Roseville, all of CA (US)

(73) Assignee: Hewlett-Packard Co., Palo Alto, CA (US)

( * ) Notice: Subject to any disclaimer, the term of this patent is extended or adjusted under 35 U.S.C. 154(b) by 0 days.

(21) Appl. No.: 09/872,194

(22) Filed: May 31, 2001

(51) Int. Cl.[7] .................................................. H05K 7/20

(52) U.S. Cl. .......................... 361/704; 29/832; 257/727; 267/158; 361/719

(58) Field of Search ................................ 165/80.3, 185; 439/66, 73, 485, 487; 174/16.3, 252; 29/832, 840, 842, 890, 35; 257/706, 707, 713, 718, 719, 726, 727; 361/702, 704, 709–711, 715, 722, 717–719; 267/148, 150, 158, 160, 162

(56) References Cited

U.S. PATENT DOCUMENTS

| 4,703,176 | A | * | 10/1987 | Hahn et al. | 250/231.14 |
|---|---|---|---|---|---|
| 5,473,510 | A | * | 12/1995 | Dozier, II | 361/719 |
| 5,880,930 | A | * | 3/1999 | Wheaton | 361/690 |
| 6,023,413 | A | * | 2/2000 | Umezawa | 361/697 |
| 6,042,388 | A | * | 3/2000 | Tustaniwskyj et al. | 439/66 |
| 6,068,250 | A | * | 5/2000 | Hawkins et al. | 267/162 |
| 6,212,074 | B1 | * | 4/2001 | Gonsalves et al. | |

* cited by examiner

*Primary Examiner*—Gerald Tolin

(57) ABSTRACT

A method and substrate using a wave spring to clamp a component to the substrate. One embodiment of the invention involves a method to use a wave spring to clamp a component to a substrate. The method includes placing the component on the substrate, placing a structure having holes on the component, placing a number of wave springs on a corresponding number of bolts, inserting the bolts into the holes in the structure, and attaching the bolts to the substrate. A second embodiment of the invention involves a substrate with an electrical contact area, an interposer placed on the electrical contact area, a component placed on the interposer, a block having holes placed on the component, bolts and wave springs inserted in the holes, wherein the bolts and wave springs clamp the component, the interposer and the substrate together on the electrical contact area of the substrate.

20 Claims, 6 Drawing Sheets

MECHANICAL LOADING OF A LAND GRID ARRAY COMPONENT USING A WAVE SPRING

BACKGROUND OF THE INVENTION

1. Field of the Invention

This invention relates generally to using a wave spring to clamp an IC component to a substrate, and more specifically relates to using a wave spring to clamp a land grid array (LGA) IC component to a printed circuit board.

2. Description of the Prior Art

In many data processing systems (e.g., computer systems, programmable electronic systems, telecommunication switching systems, control systems, and so forth) very large pin count electrical components (e.g., application specific integrated circuits and processor chips) are assembled on substrates (e.g., printed circuit boards, other flexible substrates, multi-chip modules, and equivalents). One type of packaging that is frequently used for a very large pin count electrical component is what is commonly known as a land grid array (LGA) component. Electrical connections between the LGA component pins and the corresponding conductive pads on the substrate are typically achieved by compressing an interposer (e.g., an elastomeric conductive material) containing several perpendicular conductive channels (e.g., buttons or columns filled with conductive balls or conductive threads).

In order to achieve reliable electrical connection between the LGA pins and the conductive pads of the substrate, such LGA components are clamped by screws and springs to the substrate with high perpendicular clamping forces (exceeding several hundred pounds or several hundred newtons of force). However, achieving such large perpendicular forces with conventional springs requires either the use of long springs (and screws) that vertically project above the substrate, or the use of shorter springs with very large spring constants.

One problem with using long springs (and screws) is that the vertical projection above the plane of the substrate seriously limits the packaging density of adjacent parallel substrates in order to avoid contact to an adjacent substrate by the springs and screws of another substrate. A problem with using shorter springs with very large spring constants is that the clamping force is determined by the mechanical tolerances in compressing the springs, but there is a significant manufacturing deviation (e.g., +/–10% in the spring constant from one spring to another spring in the same manufactured lot. Therefore, if two springs with very large spring constants are mechanically compressed by an equal distance, the resulting forces applied by the two springs can be greatly unequal, causing uneven clamping and uneven electrical contacts to the interposer and the conductive pads of the substrate under the LGA component. Uneven electrical contacts in turn can cause poor electrical contacts that produce a permanent or an intermittent failure in system operation. Another problem with short, conventional springs is that the springs are compressed near or to a coil-bound or solid height condition outside of their usable range.

Since the pin counts for IC components are continually increasing, the necessary clamping forces for LGA components and the necessary spring forces will increase. Without improved springs to apply the clamping force, very long springs will be needed, or short springs with high spring constants and large force variations will produce an increasing number of poor electrical contacts between LGA components, interposers, and substrates, resulting in increasing operational and reliability failures.

It would be desirable to use a relatively shorter spring with a smaller spring constant that can supply the necessary spring force to clamp a component to a substrate.

SUMMARY OF THE INVENTION

The present invention uses a relatively shorter spring with a smaller spring constant that can supply the necessary spring force to clamp a component to a substrate.

A first aspect of the invention is directed to a method to use a wave spring to lamp a component to a substrate having a first side and a second side. The method includes placing the component on the first side of the substrate; placing a structure on the component, wherein the structure has a plurality of holes; placing a plurality of wave springs on a plurality of bolts; inserting the plurality of bolts into the plurality of holes of the structure; and attaching the plurality of bolts to the substrate.

A second aspect of the invention is directed to an assembled substrate. The assembled substrate includes a substrate having a first and a second side, and an electrical contact area on the first side; an interposer placed on the electrical contact area; a component placed on the interposer; a block having a plurality of holes placed on the component; a plurality of bolts and a plurality of wave springs inserted in the plurality of holes, wherein the plurality of bolts and wave springs clamp the component, the interposer and the substrate together on the electrical contact area of the substrate.

These and other objects and advantages of the invention will become apparent to those skilled in the art from the following detailed description of the invention and the accompanying drawings.

DETAILED DESCRIPTION OF PREFERRED EMBODIMENTS OF THE INVENTION

The present invention uses a wave spring to clamp a component to a substrate, such as a printed circuit board (PCB) or a multi-chip module. While the discussion below is directed to an application of the invention to a LGA component and a heat-sink assembled on a substrate (e.g., a PCB), the invention can also be applied to other types of electrical components (e.g., transformers, power supplies, connectors) held to a substrate by using another structure, for example a block, a clamp, or a heat dissipation device (e.g., a heat-sink, a heat-pipe, a fluid cooling device, a cooling fan, or an equivalent). Components can be also assembled on other substrates (e.g., multi-chip modules, and flexible substrates upon which electrical components can be assembled).

Figure 1:
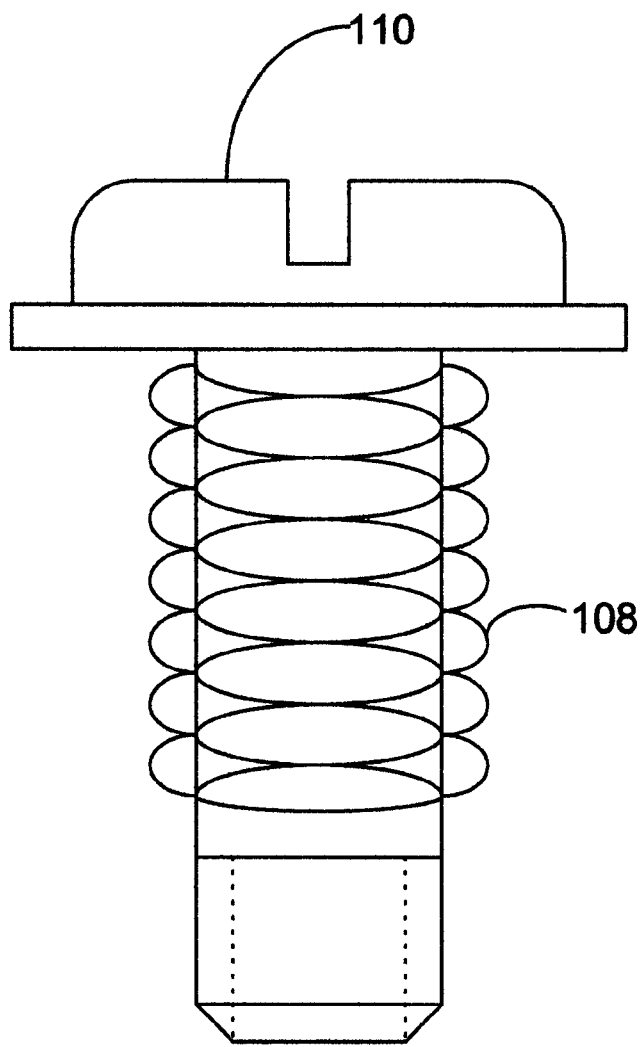
FIG. 1 illustrates a side view of a wave spring on a bolt, according to one embodiment of the present invention.

FIG. 1 illustrates a side view of a wave spring 108 on a bolt 110, according to one embodiment of the present invention. The wave spring 108 (e.g., a Spirawave® spring such as a Crest-to-Crest® spring available from Smalley® Steel Ring Company with corporate headquarters in Wheeling, Ill.) is typically made from stainless steel or carbon steel alloys and surrounds bolt (e.g., a metal screw) 110 to compress a component (not shown) to a substrate (not shown).

Figure 2:
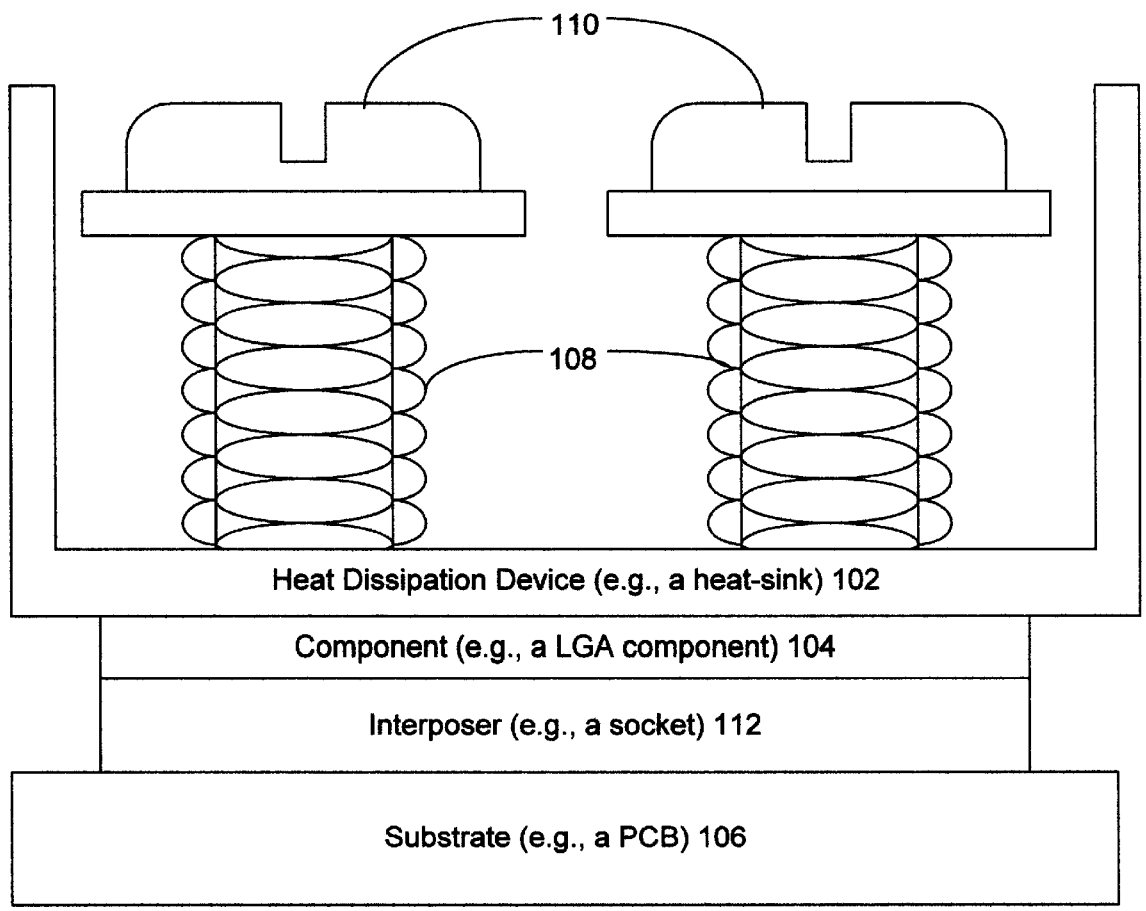
FIG. 2 illustrates a side view of two wave springs and two bolts that clamp a block or heat dissipation device (e.g., a heat sink) and a component (e.g., a LGA component) to an interposer (e.g., a socket) and a substrate (e.g., a printed circuit board), in accordance with one preferred embodiment of the present invention.

FIG. 2 illustrates a side view of two wave springs 108 and two bolts 110 that clamp a block or heat dissipation device (e.g., a heat sink) 102 and a component (e.g., a LGA component) 104 to an interposer (e.g., a socket) 112 and a substrate (e.g., a printed circuit board) 106, in accordance with one preferred embodiment of the present invention. Each wave spring 108 surrounds a bolt (e.g., a metal screw) 110 to compress the heat-sink 102 and the component 104 to the substrate 106. The wave spring 108 is sufficiently short that it does not extend in height above the height of the heat-sink 102. The heat-sink 102 can be the structure or block used to clamp the component to the substrate.

Since the wave springs are comparatively shorter than conventional springs with equivalent spring constant values, the bolts can be shorter. Therefore, the total height of the substrate assembled with a heat dissipation device can be shorter because of the use of wave springs. The use of wave springs allows adjacent substrates to be packed more closely together to reduce the overall size of a data processing system.

Figure 3:
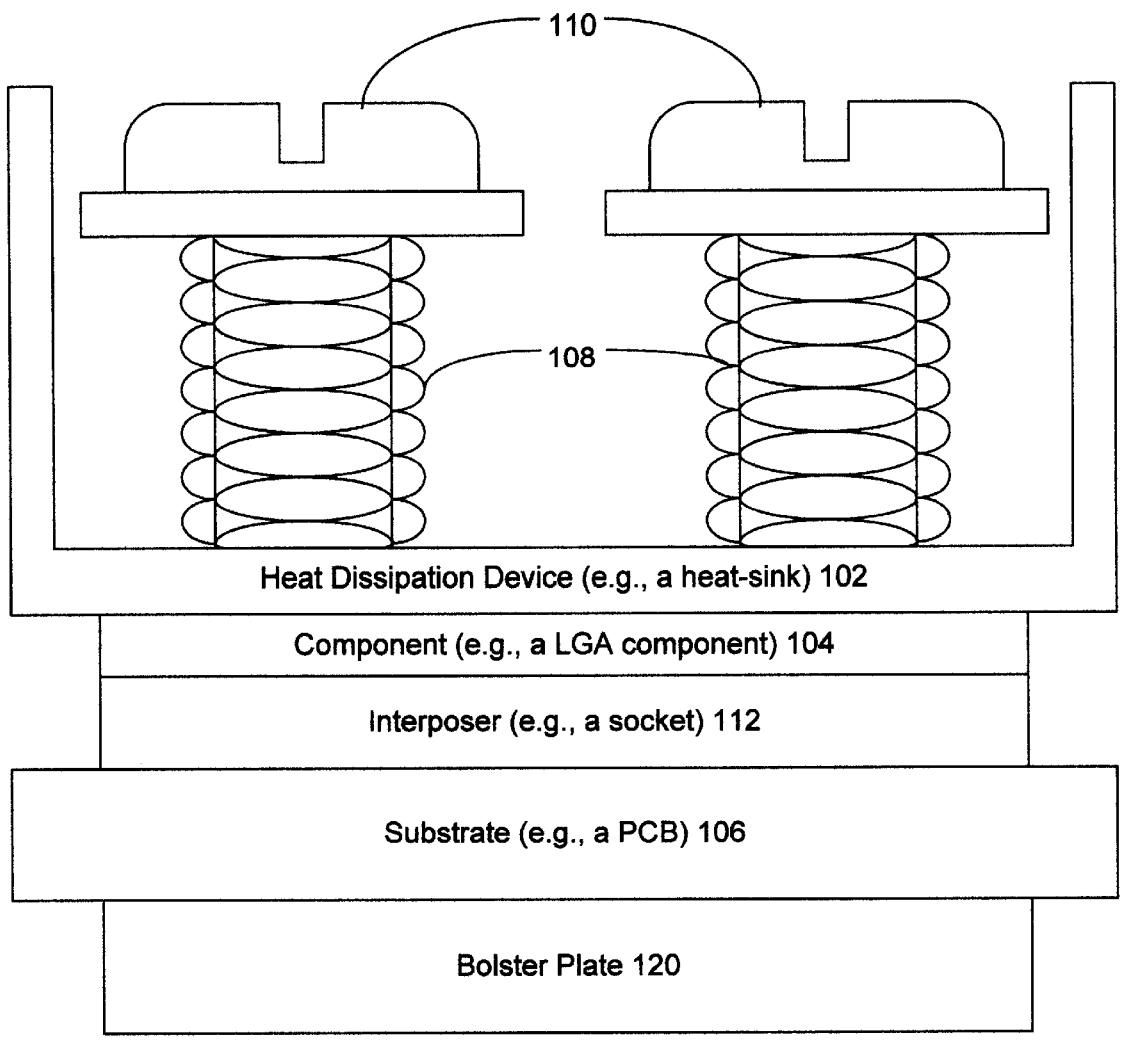
FIG. 3 illustrates a side view of two wave springs and two bolts that clamp a block or heat dissipation device and a component to an interposer, a substrate, and a bolster plate, in accordance with one preferred embodiment of the present invention.

FIG. 3 illustrates a side view of two wave springs 108 and two bolts 110 that clamp a block or heat dissipation device 102 and a component 104 to an interposer 112, a substrate 106, and a bolster plate 120, in accordance with one preferred embodiment of the present invention. Each wave spring 108 surrounds a bolt 110 to compress the heat-sink 102 and the component 104 to the substrate 106 and bolster plate 120. The bolster plate 120 is typically bolted or screwed under the substrate 106 if the clamping force for a LGA component is very high, in order to provide additional flatness and rigidity to the substrate 106, and provide a uniform load distribution across the electrical contact region of the LGA component 104.

Figure 4:
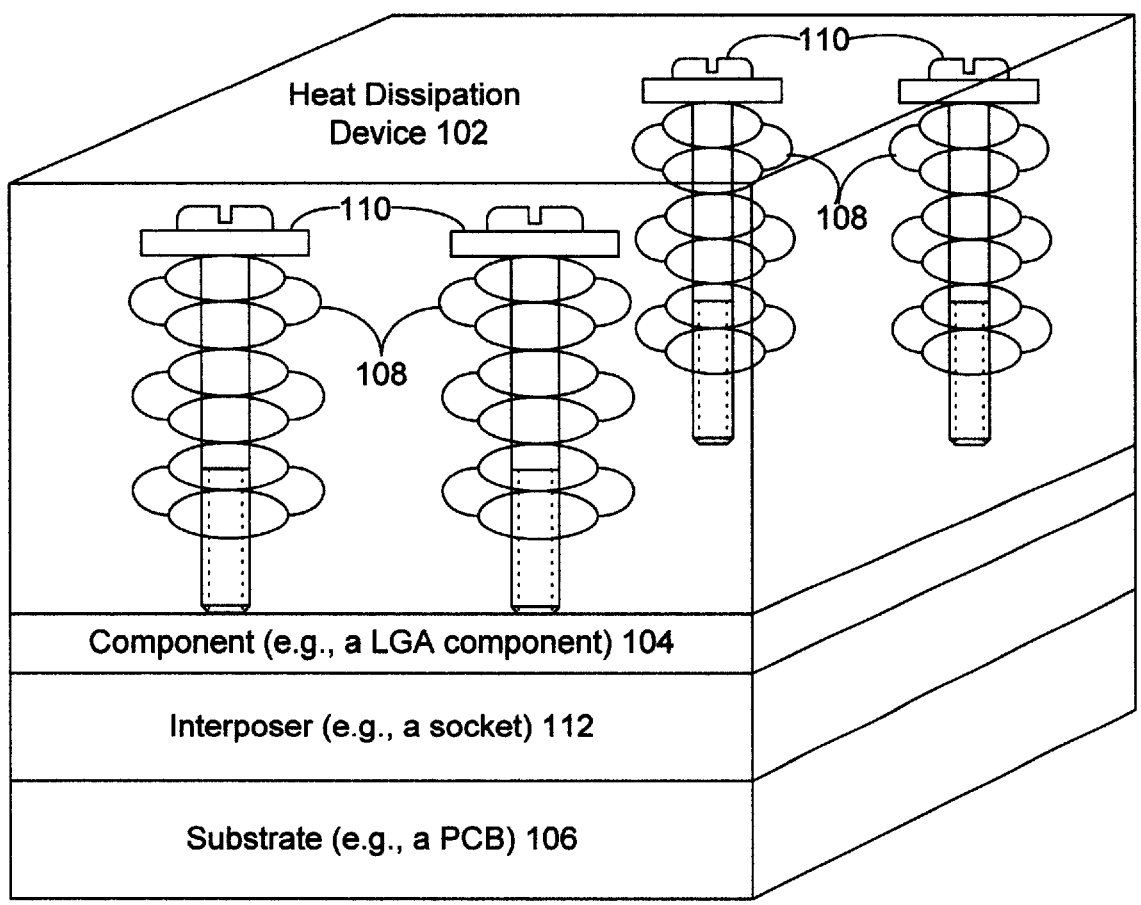
FIG. 4 illustrates a perspective view of a heat dissipation device and a component clamped to a substrate by four wave springs and four bolts, in accordance with one preferred embodiment of the present invention.

FIG. 4 illustrates a perspective view of a heat dissipation device 102 and a component 104 clamped to a substrate 106 by four wave springs 108 and four bolts 110, in accordance with one preferred embodiment of the present invention. The four wave springs 108 surround the four bolts (e.g., metal screws) 110 to compress the heat dissipation device 102 and the component 104 to the substrate 106. The clamping of the component 104 makes electrical connections between the substrate 106, the interposer 112, and the component 104.

Figure 5:
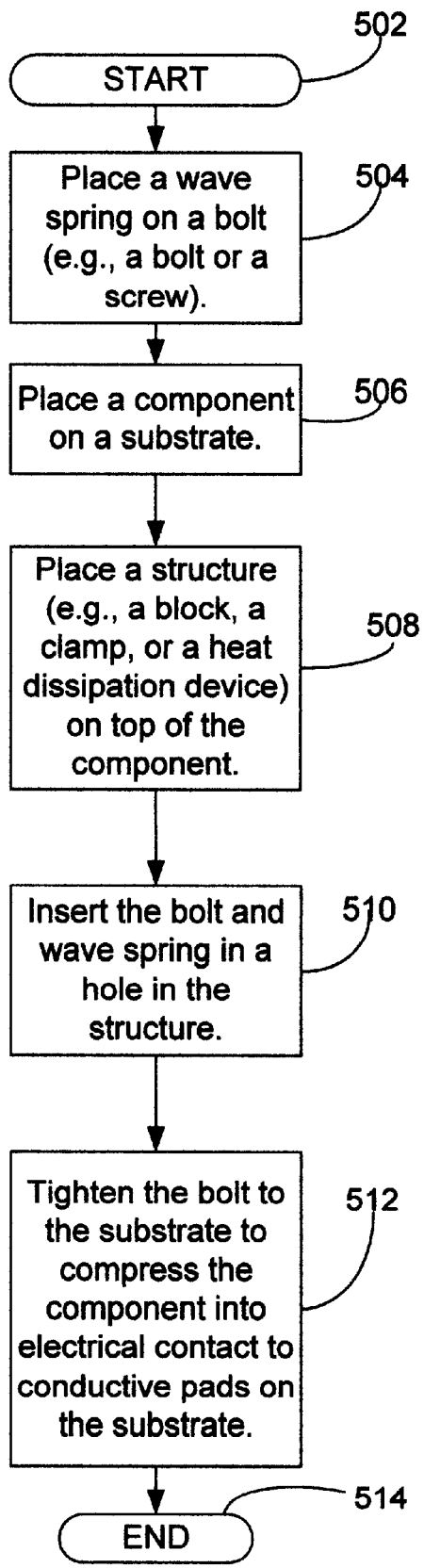
FIG. 5 shows one flow chart for a method to assemble a component on a substrate in accordance with one embodiment of the p resent invention.

FIG. 5 shows one flow chart for a method to assemble a component on a substrate in accordance with one embodiment of the present invention. The method starts in operation 502, and is followed by operation 504. In operation 504, a wave spring is placed on a bolt. Operation 506 is next, where component is placed on a substrate. Operation 508 is next, where a heat dissipation device or a clamp is placed on top of the component. Operation 510 is next, where the wave spring and bolt are placed in a hole in the heat dissipation device or clamp. Operation 512 is next, where the bolt is tightened to the substrate. Operation 514 is the end of the method.

Figure 6:
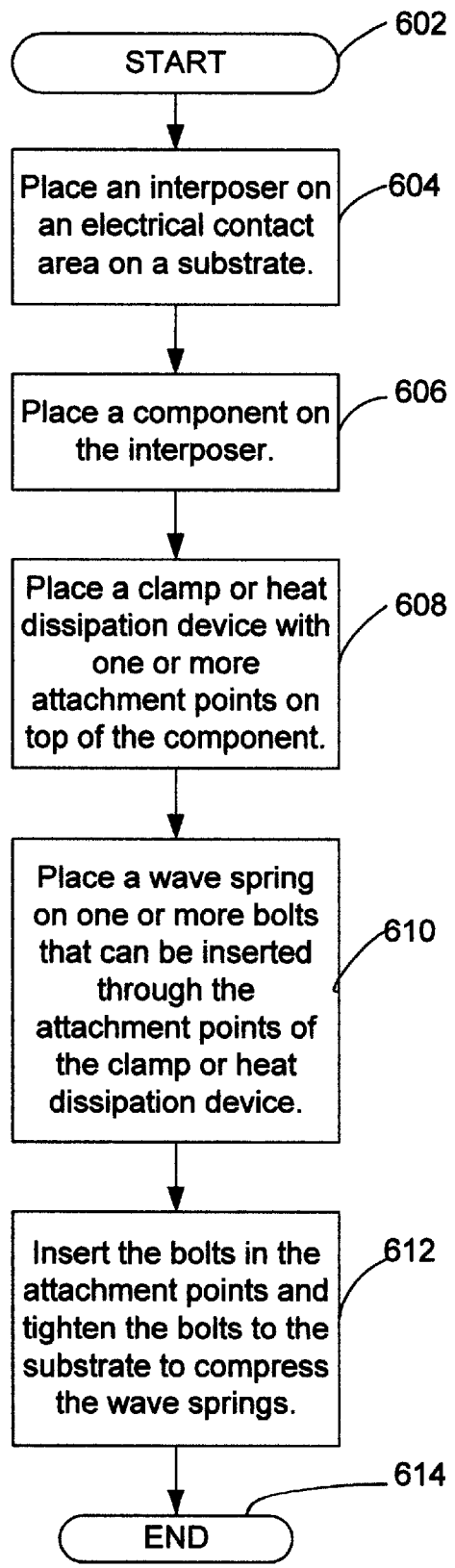
FIG. 6 shows a flow chart for a method to assemble a component to a substrate using one or more wave springs, in accordance with one preferred embodiment of the present invention.

FIG. 6 shows a flow chart for a method to assemble a component to a substrate using one or more wave springs, in accordance with one preferred embodiment of the present invention. The method starts in operation 602, and is followed by operation 604. In operation 604 an interposer is placed on an electrical contact area on a substrate. In operation 606 a component is placed on the interposer. In operation 608 a clamp or heat dissipation device with one or more attachment points (e.g., holes, or notches) is placed on top of the component. In operation 610 a wave spring is placed on one or more bolts that can be inserted through the attachment points. Operation 612 is next, where the bolts are inserted in the attachment points and tightened to the substrate, and the wave springs are compressed to apply a clamping force to the component and the substrate. Operation 614 is the end of the method.

The embodiments of the invention discussed above mainly described examples of substrates assembled with LGA components. However, alternative embodiments of the invention can be applied to other components (e.g., clamped IC components, transformers, power supplies, connectors, or other devices that can cause substrate distortion by an attachment force, clamping force, or from the weight of the component).

The exemplary embodiments described herein are for purposes of illustration and are not intended to be limiting. Therefore, those skilled in the art will recognize that other embodiments could be practiced without departing from the scope and spirit of the claims set forth below.

What is claimed is:

1. A method to use a wave spring to clamp a component to a substrate having a first side and a second side, comprising:

placing said component on said first side of said substrate;

placing a structure on said component, wherein said structure has a plurality of holes;

placing a plurality of wave springs on a plurality of bolts;

inserting said plurality of bolts into said plurality of holes of said structure; and attaching said plurality of bolts to said substrate.

2. The method of claim 1, wherein said component is a land grid array (LGA) component.

3. The method of claim 1, wherein said substrate is chosen from a substrate consisting of: a printed circuit board (PCB), a multi-chip module (MCM), or a flexible substrate.

4. The method of claim 1, wherein said structure includes a heat dissipation device consisting of: a heat-sink, a heat-pipe, a cooling fan, or a fluid circulating device.

5. The method of claim 1, wherein said wave spring is a Spirawave® spring.

6. The method of claim 5, wherein said Spirawave® spring is a Crest-to-Crest® spring.

7. The method of claim 1, further including:

placing an interposer between said component and said substrate.

8. A method to use a wave spring to clamp a component to a substrate having a first side and a second side, comprising:

placing an interposer on said first side of said substrate;

placing said component on said interposer on said first side of said substrate;

placing a block on said component, wherein said block has a plurality of holes;

placing a plurality of wave springs on a plurality of bolts;

inserting said plurality of bolts into said plurality of holes of said block; and attaching said plurality of bolts to said substrate.

9. The method of claim 8, wherein said component is a land grid array (LGA) component.

10. The method of claim 8, wherein said substrate is chosen from a substrate consisting of: a printed circuit board (PCB), a multi-chip module (MCM), or a flexible substrate.

11. The method of claim 8, wherein said block includes a heat dissipation device consisting of: a heat-sink, a heat-pipe, a cooling fan, or a fluid circulating device.

12. The method of claim 8, wherein said wave spring is a Spirawave® spring.

13. The method of claim 12, wherein said Spirawave® spring is a Crest-to-Crest® spring.

14. The method of claim 8, further including attaching a bolster plate having a plurality of holes on said second side of said substrate under said component, wherein attaching said plurality of bolts to said substrate includes inserting said plurality of bolts through said plurality of holes in said bolster plate.

15. An assembled substrate, comprising a substrate having a first side and a second side, and an electrical contact area on said first side;

an interposer placed on said electrical contact area;

a component placed on said interposer;

a structure having a plurality of holes placed on said component;

a plurality of bolts and a plurality of wave springs inserted in said plurality of holes, wherein said plurality of bolts and wave springs clamp said component, said interposer and said substrate together at said electrical contact area of said substrate.

16. The assembled substrate of claim 15, wherein said substrate is chosen from substrates consisting of: a printed circuit board (PCB), a multi-chip module (MCM), and a flexible substrate.

17. The assembled substrate of claim 15, wherein said component is a land grid array (LGA) component.

18. The assembled substrate of claim 15, further comprising a bolster plate attached to said second side of said substrate, wherein said bolster plate has a plurality of holes and said plurality of bolts is in said plurality of holes in said bolster plate.

19. The assembled substrate of claim 15, wherein said structure includes a heat dissipation device consisting of: a heat-sink, a heat-pipe, or a cooling fan.

20. The assembled substrate of claim 15, wherein said wave spring is a Spirawave® spring.

* * * * *